United States Patent [19]
Kato

[11] Patent Number: 5,773,881
[45] Date of Patent: Jun. 30, 1998

[54] ACCELERATION SENSOR DEVICE

[75] Inventor: Hajime Kato, Tokyo, Japan

[73] Assignee: Mitsubishi Denki Kabushiki Kaisha, Tokyo, Japan

[21] Appl. No.: 751,699

[22] Filed: Nov. 18, 1996

[30]    Foreign Application Priority Data

May 28, 1996 [JP] Japan ..................................... 8-133760

[51] Int. Cl.$^6$ ............................. H01L 23/02; H01L 23/48
[52] U.S. Cl. .......................... 257/685; 257/417; 257/693; 257/697; 438/51; 438/117
[58] Field of Search .................................... 257/254, 417, 257/685, 686, 693, 697, 712, 713; 438/51, 117

[56]            References Cited

U.S. PATENT DOCUMENTS

| | | | |
|---|---|---|---|
| 5,157,472 | 10/1992 | Takemura | 257/417 |
| 5,231,879 | 8/1993 | Yamamoto | 73/517 R |
| 5,408,112 | 4/1995 | Tai et al. | 257/254 |
| 5,587,608 | 12/1996 | Meng | 257/712 |
| 5,633,461 | 5/1997 | Kakizaki et al. | 73/493 |

FOREIGN PATENT DOCUMENTS

| | | |
|---|---|---|
| 1-302169 | 12/1989 | Japan . |
| 3-170065 | 7/1991 | Japan . |
| 7-167887 | 7/1995 | Japan . |

Primary Examiner—Mahshid D. Saadat
Assistant Examiner—Allan R. Wilson

[57]            ABSTRACT

An impact load effected on the single body of an acceleration sensor device is absorbed with a relatively simple construction, thereby protecting a semiconductor sensor element provided in the sensor. The acceleration sensor device comprises a semiconductor sensor element 2 which can sense an acceleration in a direction perpendicular to its principal plane, a base plate 3 which supports the sensor element 2, a package 11 which supports the base plate 3 and encloses the base plate 3 and the sensor element 2, a frame 12 which has a plurality of leg sections 12d protruding from a bottom plane of the package 11 and is fixed on the package 11, and a cap-shaped resin cover 13 which has a roof section 13a opposite to an upper surface of the package 11 or the frame 12 and covers the package 11 from above as fixed on the package 11, and a side wall section 13b of the cover 13 extends at least to a position corresponding to a place where the sensor element 2 is arranged.

5 Claims, 7 Drawing Sheets

ACCELERATION SENSOR DEVICE

BACKGROUND OF THE INVENTION

1. Field of the Invention

The present invention relates to an acceleration sensor device, and in particular, to an acceleration sensor device which uses a semiconductor sensor element capable of sensing an acceleration in a direction perpendicular to its specified plane (i.e., so-called the principal plane) as a sensor element.

2. Description of the Prior Art

Conventionally, as an acceleration sensor device, there has been a known one in which a semiconductor sensor element for sensing an acceleration by taking advantage of the piezoresistive effect of the semiconductor is used as a sensor element. By using this type of sensor element, an acceleration in a direction perpendicular to its principal plane can be sensed with high accuracy.

In the above semiconductor sensor device, by fixing its specified portion (e.g., its fixed end when it is a cantilever type) on a base member, it is supported on the base member. The acceleration sensor device is constructed by fixing and supporting the base member on a package member and enclosing the base member and the semiconductor sensor element by the package member. The package member constitutes at least part of the outer package of the acceleration sensor device, and it is generally made of a resin material.

Such an acceleration sensor device is normally used as integrated in a unit body including an electric circuit board, and generally a plurality of leg sections for fixing the sensor device to the electric circuit board are provided at a bottom portion of the acceleration sensor device. The leg sections can be formed at a terminal section of a frame member made of, for example, a metal material fixed on the package member, and they are set so that they protrude by a specified amount from the bottom plane of the package member.

In the above type of acceleration sensor device, the included semiconductor sensor element is made of a fragile material such as silicon, and this also causes a problem that the sensor element suffers a damage when an impact load greater than a certain degree is applied to it because it is dropped or subjected to a similar accident. Above all, when the impact load is effected in the direction of sensing the acceleration (i.e., in the direction perpendicular to the principal plane of the sensor element), the damage of the sensor element occurs at a lower load.

Particularly when there is a failure such as dropping the acceleration sensor device when handled individually during assembly of the sensor device into a unit body or in the precedent transport stage, generally the damage of the sensor element cannot be avoided.

In view of the above problem, the present applicant has disclosed an acceleration sensor device in which a cushioning material is attached to the peripheral surfaces of the outer package that includes a semiconductor sensor element, for example, in Japanese Patent Laid-Open Publication No. HEI 1-302169 (referred to as a first prior art hereinafter).

The present applicant has further disclosed in Japanese Patent Laid-Open Publication No. HEI 3-170065 (referred to as a second prior art hereinafter) a unit body of a package integrated with an acceleration sensor device (semiconductor acceleration sensor of a second prior art) in which its package member enclosing the outer surface of the sensor device is formed with a bellows section that is able to extend and contract in a direction coinciding with the acceleration sensing direction. According to this second prior art, the package member for supporting a base plate equipped with the acceleration sensor device is formed of a material having a great mechanical strength, and a cushioning material is attached to its outer surface.

Further, in Japanese Patent Laid-Open Publication No. HEI 7-167887 (referred to as a third prior art hereinafter) is disclosed a unit body of a cover member integrated with an acceleration sensor device (semiconductor acceleration sensor of a third prior art) provided with an impact alleviating member that protrudes outwardly of the contour of a base on which the sensor device is fixed.

According to the first prior art, even though an impact load consequent upon drop or the like is effected on the sensor device when the acceleration sensor device is individually handled, the impact load is absorbed by the cushioning material attached to the peripheral surfaces of the outer package, thereby allowing the internally provided semiconductor sensor element to be effectively protected.

However, in this case, each peripheral surface of the outer package is individually provided with the cushioning material, and this has caused such a problem that much labor is required for fixing these cushioning materials to the corresponding peripheral surfaces.

Furthermore, according to the construction disclosed in the second prior art or the third prior art, the package or cover member of the unit body integrated with the acceleration sensor device is provided with a mechanism for absorbing the impact, and these mechanisms are not intended to directly protect the acceleration sensor device itself.

Therefore, according to the construction disclosed in the second prior art or the third prior art, the sensor device cannot be effectively protected against the effect of an impact load consequent upon drop or the like when individually handling the acceleration sensor device in the stage of assembly of the sensor device into the unit body or in the precedent transport stage.

SUMMARY OF THE INVENTION

Accordingly, it is an object of the present invention to provide an acceleration sensor device capable of absorbing an impact load effected on the single unit of the acceleration sensor device with a relatively simple construction and thereby protecting an internally provided semiconductor sensor element.

In order to achieve the above-mentioned object, an acceleration sensor device according to a first embodiment of the present invention includes: a semiconductor sensor element which can sense an acceleration in a direction perpendicular to a specified plane (principal plane); a base member which supports the sensor element; a package member which supports the base member and encloses the base member and the semiconductor sensor element; a frame member which has a plurality of leg sections protruding from a bottom plane of the package member and is fixed on the package member; and a cap-shaped resin cover member which has a roof section opposite to an upper surface of the package member or the frame member and covers the package member from above as fixed on the package member, wherein a side wall section of the cover member extends at least to a position corresponding to a place where the sensor element is arranged.

In the above case, it is preferred that the resin cover member should be fixed on the package member as removably engaged with it by a force within an elastic limit of its material.

Furthermore, an acceleration sensor device according to a second embodiment of the present invention includes: a semiconductor sensor element which can sense an acceleration in a direction perpendicular to a specified plane (principal plane); a base member which supports the sensor element; a resin package member which supports the base member and encloses the base member and the semiconductor sensor element; and a frame member which has a plurality of leg sections protruding from a bottom plane of the package member and is fixed on the package member, wherein the package member is provided with a plurality of protrusions which are formed integrally with the package member and protrude outwardly in a plane that is other than the bottom plane and parallel to the specified plane of the semiconductor sensor element.

Furthermore, an acceleration sensor device according to a third embodiment of the present invention includes: a semiconductor sensor element which can sense an acceleration in a direction perpendicular to a specified plane; a base member which supports the sensor element; a package member which supports the base member and encloses the base member and the semiconductor sensor element; a metal frame member which has a plurality of leg sections protruding from a bottom plane of the package member and is fixed on the package member, wherein the frame member is set so that its section including a portion corresponding to a place where the sensor element is arranged bulges outwardly of the package in a plane that is other than the bottom plane and parallel to the specified plane of the semiconductor sensor element.

In the above case, it is preferred that the bulged section of the frame member is formed in a wave-like form.

DETAILED DESCRIPTION OF THE PREFERRED EMBODIMENTS

Preferred embodiments of the present invention will be described in detail below with reference to the accompanying drawings.

First embodiment

Figure 1:
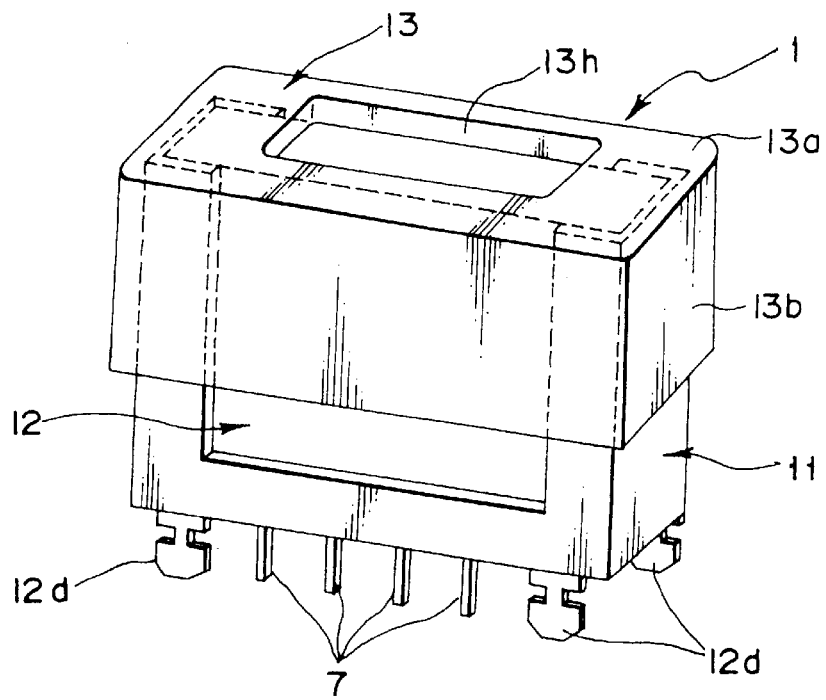
FIG. 1 is a perspective view of an acceleration sensor device according to a first embodiment of the present invention.
Figure 2:
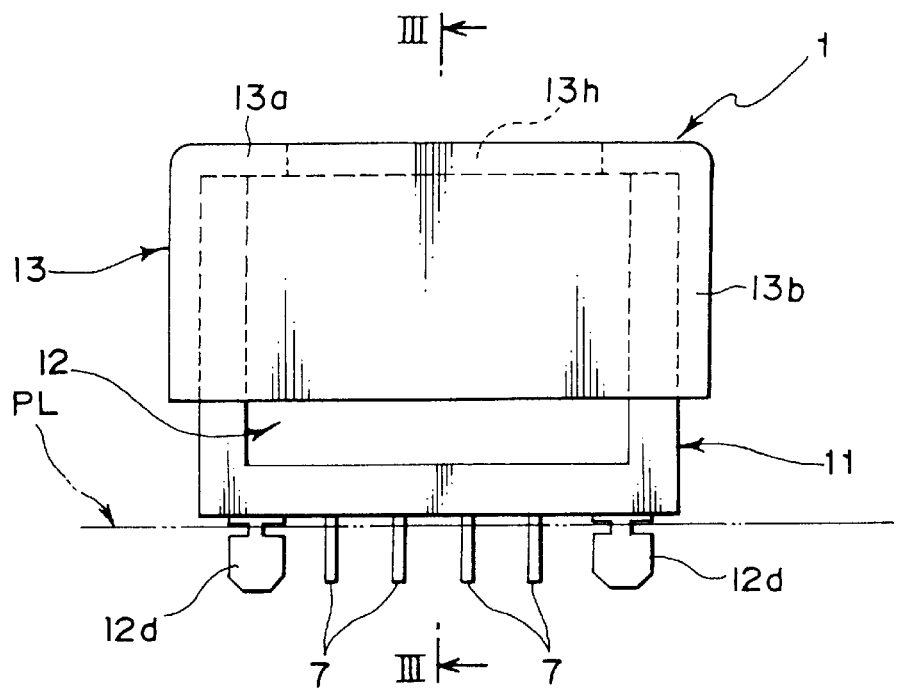
FIG. 2 is a frontal explanatory view of the acceleration sensor device of the first embodiment.
Figure 3:
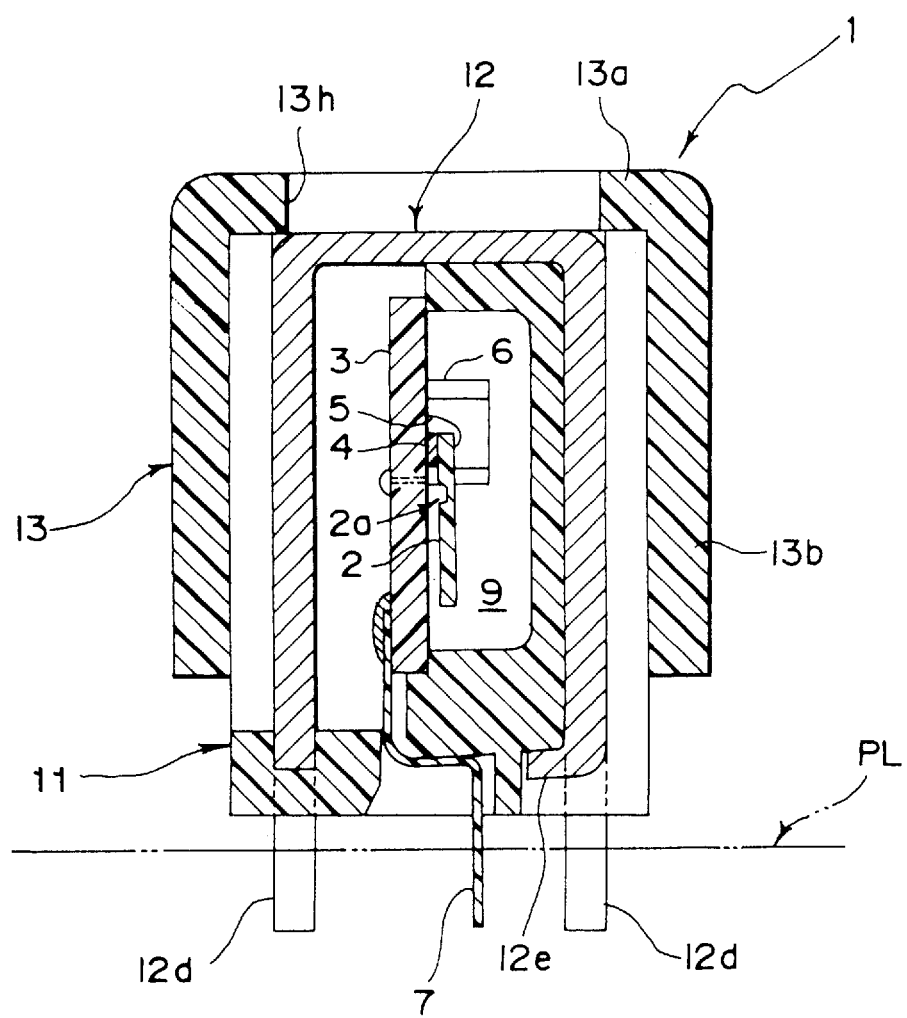
FIG. 3 is an explanatory view of a longitudinal cross section taken along the line III-III in FIG. 2.

First of all, an acceleration sensor device 1 (properly referred to simply as a sensor device hereinafter) according to a first embodiment of the present invention as shown in FIGS. 1 through 4 will be described. FIG. 3 is an explanatory view of a longitudinal cross section of the sensor 1 of the present embodiment. As shown in FIG. 3, the sensor device 1 is internally provided with a semiconductor sensor element 2 (properly referred to simply as a sensor element hereinafter) capable of sensing an acceleration in a direction perpendicular to a specified plane (so-called the principal plane) and a base plate 3 for supporting the sensor element 2.

As conventionally well known, the semiconductor sensor element 2 is to sense an acceleration by taking advantage of the piezoresistive effect of the semiconductor, and in this embodiment, it is implemented by, for example, a cantilever type made of silicon (Si).

That is, the sensor element 2 is constructed as, for example, an approximately rectangular parallelopiped plate (thin plate), and with its one end fixed to the base plate 3 via a pedestal 4, it is supported on the base plate 3 in a cantilever style. Between the fixed end and the free end of the sensor element 2 is provided a groove 2a. When an acceleration is effected in a direction perpendicular to a plane (principal plane) of the sensor element 2 parallel to the base plate 3, a maximum sensor sensitivity can be obtained at this portion. It is to be noted that the semiconductor sensor element 2 is similar to the known one, and therefore, no detailed description of its structure, operation and so forth is provided.

On the base plate 3 is fixed, for example, a capacitor 6 other than the sensor element 2. Further, between the fixed end of the sensor element 2 and the base plate 3 is provided a lead wire 5 for taking out an output of the sensor element 2.

The sensor device 1 is further provided with a package member 11 for supporting the base plate 3 and enclosing the base plate 3 and the semiconductor sensor element 2, and a frame member 12 fixed on the package 11. The frame member 12 is more preferably formed of, for example, a metal sheet, while the package member 11 is more preferably formed of, for example, a synthetic resin.

In regard to the base plate 3, its peripheral portion at one surface side is fixed to the resin package 11 by means of, for example, an adhesive, while the sensor element 2, the lead wire 5 and the capacitor 6 are stored in an internal space 9 defined by the base plate 3 and the package member 11.

It is to be noted that the base plate 3 is provided with a through hole for discharging air in the internal space 9, and the through hole is buried with, for example, solder after the air is discharged.

The metal frame member 12 is provided with a plurality of (e.g., four) leg sections 12d protruding from the bottom plane of the package member 11. By these leg sections 12d, the acceleration sensor device 1 is fixed to an electric circuit board PL of an acceleration measuring unit (not shown).

Furthermore, on the rear surface side of the base plate 3 is fixed by, for example, soldering an end of a lead wire 7 for transferring the output of the sensor element 2 to the electric circuit board PL.

It is to be noted that the acceleration sensor device 1 of the present embodiment is so-called the upright type in which the principal plane of the sensor element 2 is arranged perpendicular to the electric circuit board PL. This type of acceleration sensor device is used for sensing the acceleration of a car body in the fore-and-aft direction in, for example, an air bag system of a vehicle such as a motor vehicle.

As shown best in FIGS. 1 and 2, the acceleration sensor device 1 of the present embodiment is provided with a cap-shaped cover 13 which covers the package 11 from above and is fixed by, for example, engagement. The cover 13 is more preferably formed of a silicon resin having a relatively high heat resistance.

It is to be noted that, instead of the silicon resin, for example, so-called the engineering plastic such as PPS (polyphenylene sulfide) or PBT (polybutylene terephthalate) can be used.

The resin cover 13 has a roof section 13a opposite to the upper surface of the package 11 or the frame 12, and its side wall section 13b extends at least to a position corresponding to the place where the sensor element 2 is arranged (refer to FIG. 3).

With the above arrangement, the upper portion and the side portion of the sensor element 2 are covered with the resin cover 13, and an impact load effected in any of these directions is effectively absorbed by the resin cover 13. On the other hand, below the sensor element 2 is protruding a plurality of leg sections 12d of the frame member 12 from the bottom plane of the package 11, and therefore, the impact load from below is absorbed by the leg sections 12d.

That is, even though an impact load is effected as a consequence of drop or the like when the acceleration sensor device 1 is individually handled, the internally provided semiconductor sensor element 2 can be effectively protected.

Furthermore, in this case, with the simple construction of putting the cap-shaped resin cover 13 on it, the impact resistance when individually handling the acceleration sensor device 1 can be improved.

Furthermore, according to the present embodiment, more preferably the resin cover 13 is dimensionally set at each portion so that it can be fixed as removably engaged with the package 11 by a force within the elastic limit of its material. Therefore, for example, after completing handling of the sensor device 1 or in a similar case, the cover can be relatively easily removed and is able to be easily reused for another sensor to be individually handled.

The roof section 13a of the cover 13 is more preferably provided with an approximately rectangular opening 13h to increase the flexibility of the roof section 13a of the cover 13, thereby allowing the cover 13 to be easily attached and detached.

By forming the inner surface of the side wall section 13b of the cover 13 in a tapered shape such that the interval between the mutually opposite side wall sections 13b is made smaller at the lower side than at the higher side, the fixation force of the cover 13 that is fixed as engaged with the package 11 can be increased.

Furthermore, when the cover is not reused, the cover may be fixed to the package or the frame by an adhesive or the like.

Figure 4:
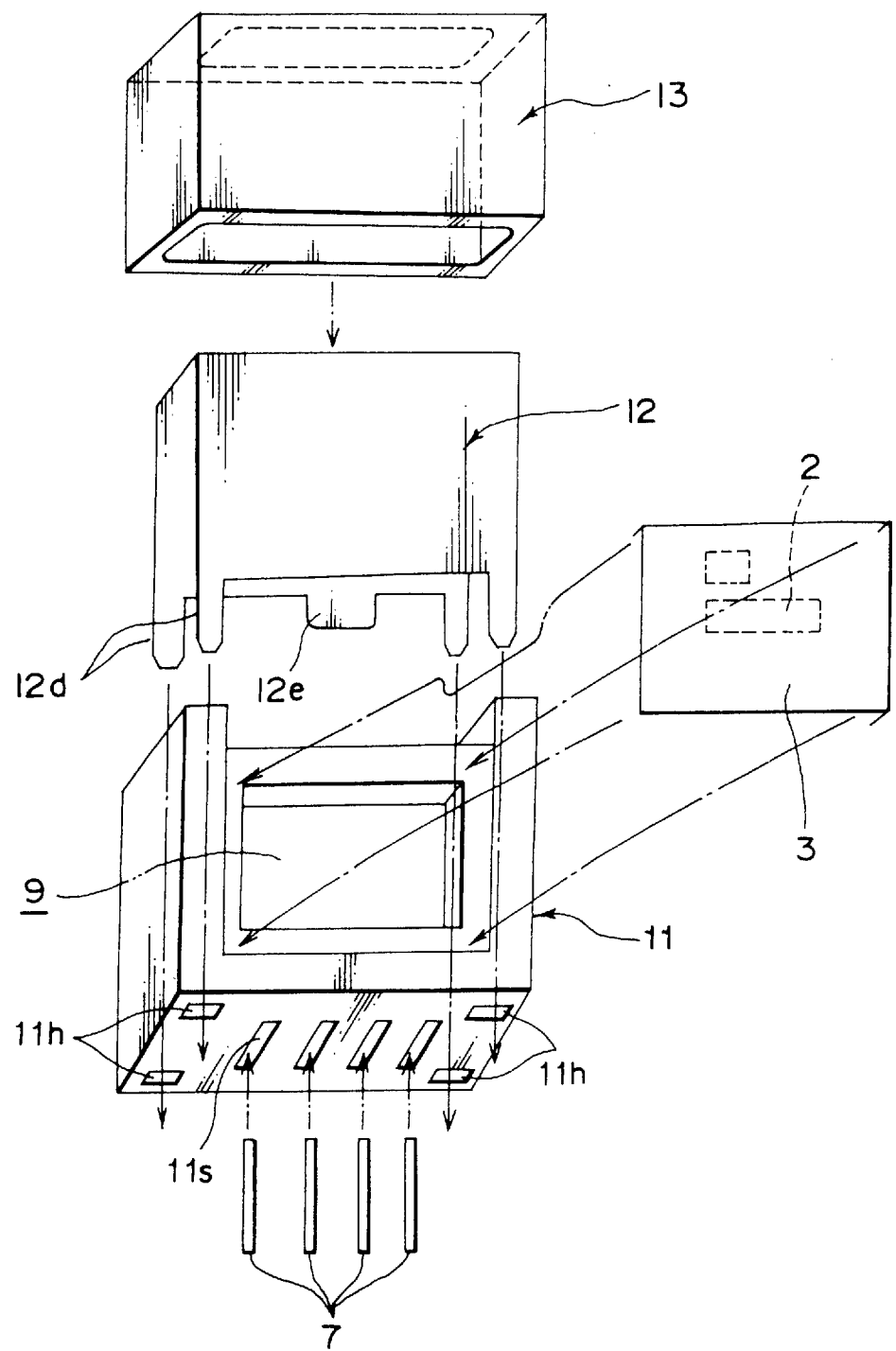
FIG. 4 is an exploded perspective view of the acceleration sensor device of the first embodiment.

When assembling the acceleration sensor device 1, as shown in FIG. 4, firstly the base plate 3 with sensor element 2 fixed thereto is fixed to the package member 11. Then, each lead wire 7 is inserted from a bottom slit 11s of the package 11, and thereafter its terminal end (upper end) is fixed to the base plate 3 by solder or the like.

Next, the metal frame 12 is inserted from above into the resin package 11 to be assembled, and a projecting section 12e is bent to fix them to each other. In the present case, the leg sections 12d of the frame member 12 protrude downward penetrating through a bottom opening 11h of the package member 11.

Then, the resin cover 13 is put from above on the package 11 or the frame 12 to complete the assembling.

Modification example of First embodiment

A modification example of the first embodiment will be described next with reference to FIGS. 5 through 7.

This modification example is basically similar to the first embodiment. As shown best in FIG. 7, it is so-called the horizontal type in which its sensor element 22 is arranged in parallel with an electric circuit board PL. This type of acceleration sensor device is used for sensing the acceleration of a car body in the widthwise direction in, for example, an air bag system of a vehicle such as a motor vehicle.

Figure 7:
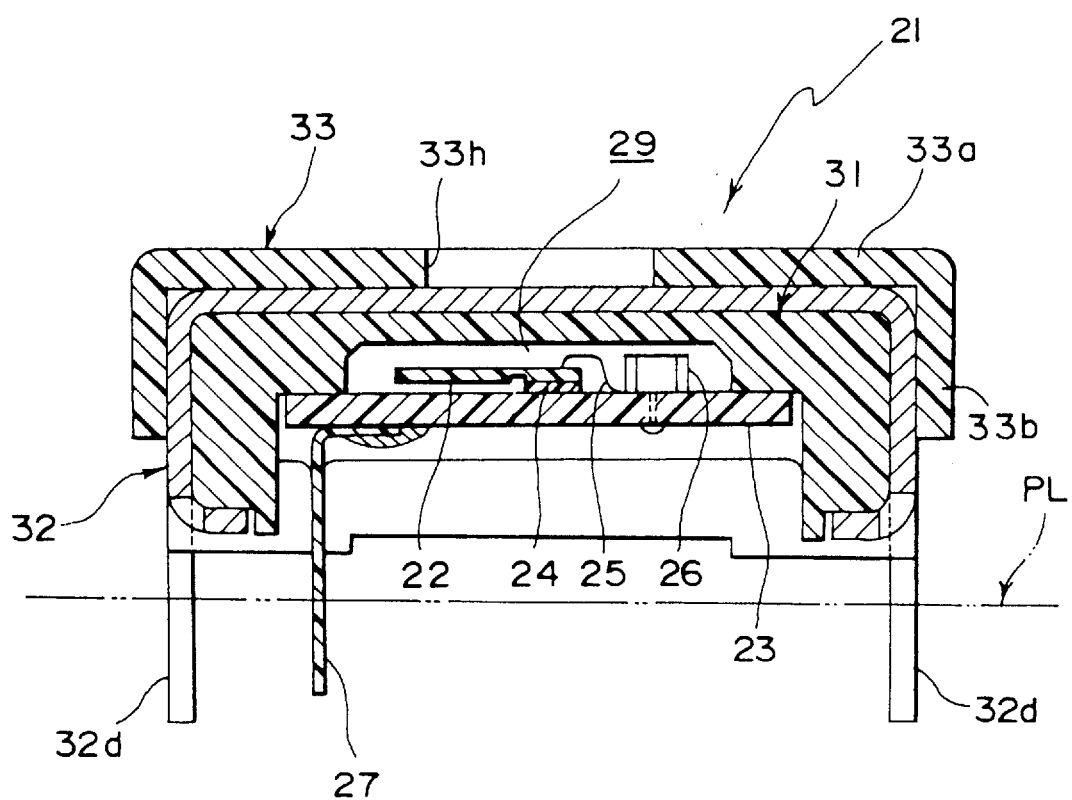
FIG. 7 is an explanatory view of a longitudinal cross section taken along the line VII-VII in FIG. 6.

As shown in FIG. 7, in the acceleration sensor device 21 of the present modification example, components (sensor element 22, base plate 23, pedestal 24, lead wire 25 and capacitor 26) having constructions and functions similar to those of the components of the aforementioned sensor device 1 are placed in an internal space 29 defined by the base plate 23 and a resin package 31, and a lead wire 27 is connected to the base plate 23.

On the package 31 is fixed a metal frame 32 having four leg sections 32d. The metal frame 32 has a slightly varied structure of fixation to the resin package 31, however, it is basically similar to the frame 12 of the aforementioned sensor device 1.

Figure 5:
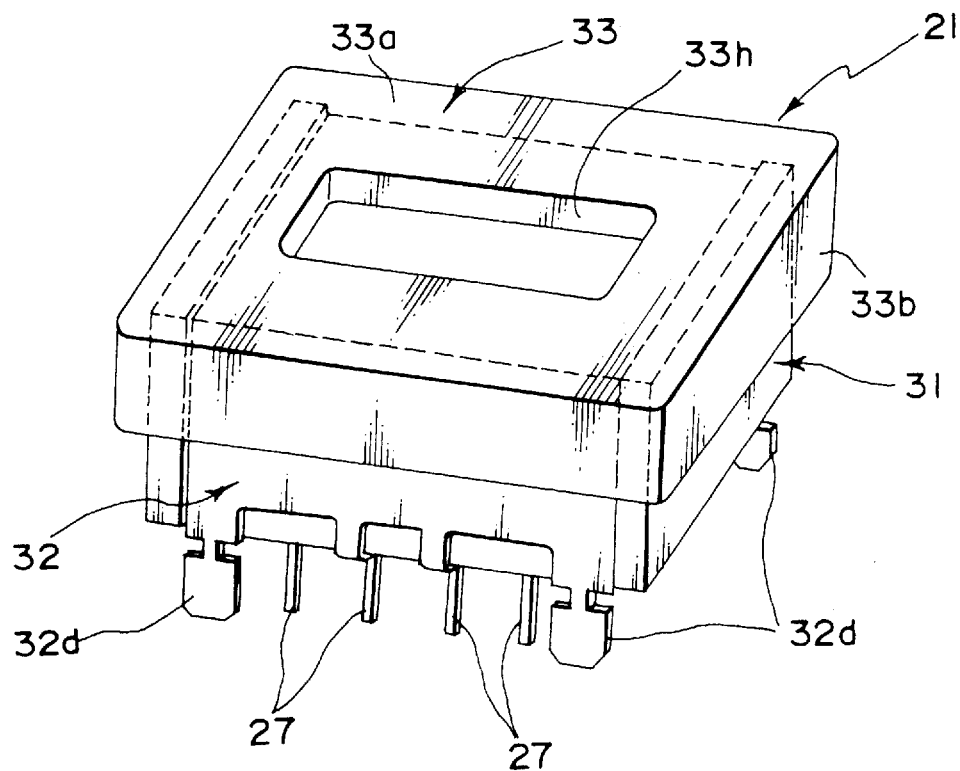
FIG. 5 is a perspective view of an acceleration sensor device according to a modification example of the first embodiment.
Figure 6:
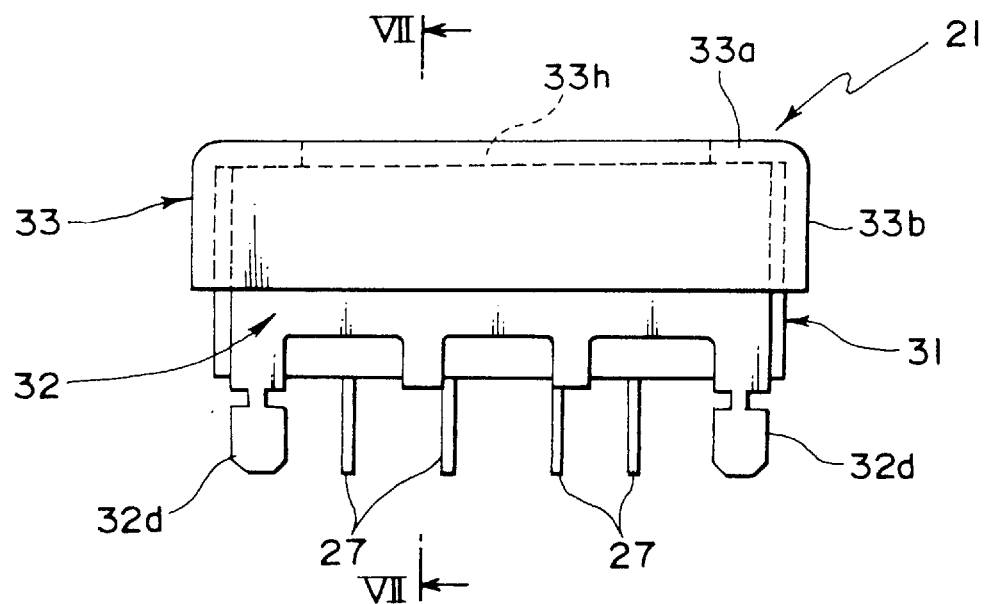
FIG. 6 is a frontal explanatory view of the acceleration sensor device of the above modification example.

Then, as shown best in FIGS. 5 and 6, a cap-shaped cover 33 that covers from above the package 31 and the frame 32 and is fixed by engagement.

This cover 33 is formed of a resin material similar to that of the aforementioned sensor device 1, and its side wall section 33b extends at least to a position corresponding to the place where the sensor element 22 is arranged (refer to FIG. 7). Further, a roof section 33a of the cover 33 is provided with a rectangular opening 33h.

That is, also in the sensor device 21 of the present modification example, the upper portion and the side portion of the sensor element 22 are covered with the resin cover 33. Below the sensor element 22 is protruding a plurality of leg sections 32d of the frame 32 through the bottom plane of the package 31, so that an effect similar to that of the aforementioned sensor device 1 can be produced.

Second embodiment

Figure 8:
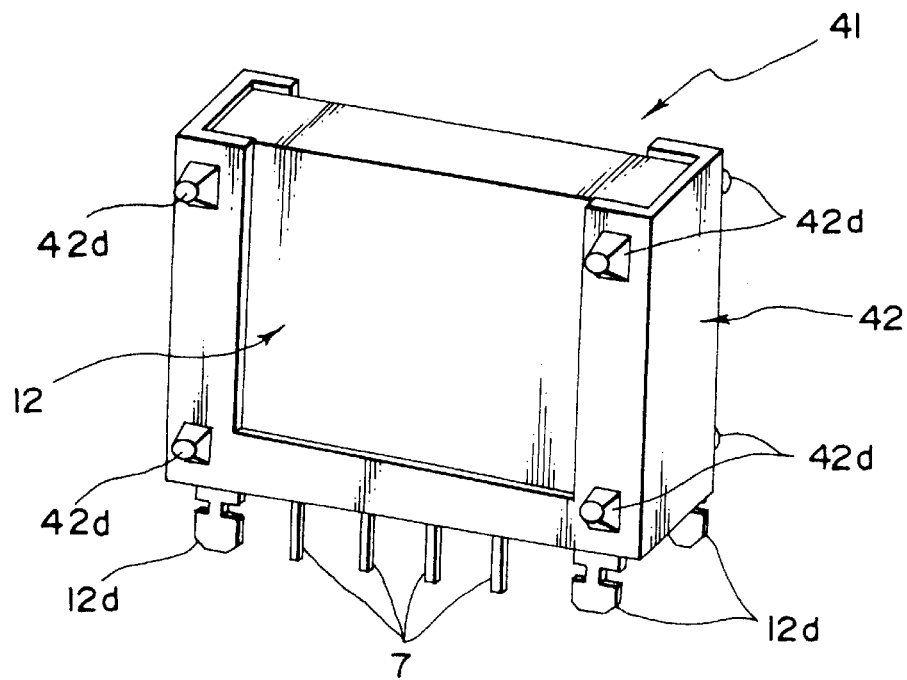
FIG. 8 is a perspective view of an acceleration sensor device according to a second embodiment of the present invention.

An acceleration sensor device 41 according to a second embodiment of the present invention as shown in FIG. 8 will be described next. It is to be noted that the present sensor device 41 is the upright type and has the same construction as that. of the sensor device 1 of the first embodiment shown in FIGS. 1 through 4 except for a resin package 42. Therefore, in regard to the components other than the package 42, the same components as those of the aforementioned sensor device 1 will be denoted by the same reference numerals, and no further description is provided therefor.

According to the present embodiment, the resin package 42 is provided with a plurality of (e.g., four) protrusions 42d which are integrated with the package 42 and protrude outwardly in a plane that is other than its bottom plane and is parallel to the principal plane of the semiconductor sensor element 2.

By providing such protrusions 42d, when an impact load greater than a certain degree of intensity is effected in a direction perpendicular to the principal plane in which the sensor element 2 has the lowest impact resistance, the protrusions 42d will be deformed or broken to be able to absorb the impact load. On the other hand, a plurality of leg sections 12d of the metal frame 12 are protruding from the bottom plane of the resin package 42 at the bottom surface side of the sensor element 2, and therefore, the impact load from the bottom surface side is absorbed by the leg sections 12d. Therefore, even though an impact load is effected as a consequence of drop or the like when the sensor device 41 is individually handled, the internally provided sensor element 2 can be effectively protected.

Furthermore, the protrusions 42d can be formed easily integrally in a molding stage of the package 42. With the simple construction of providing the package 42 with the plurality of protrusions 42d, the Impact resistance in singly handling the sensor 41 can be improved.

Modification example of second embodiment

Figure 9:
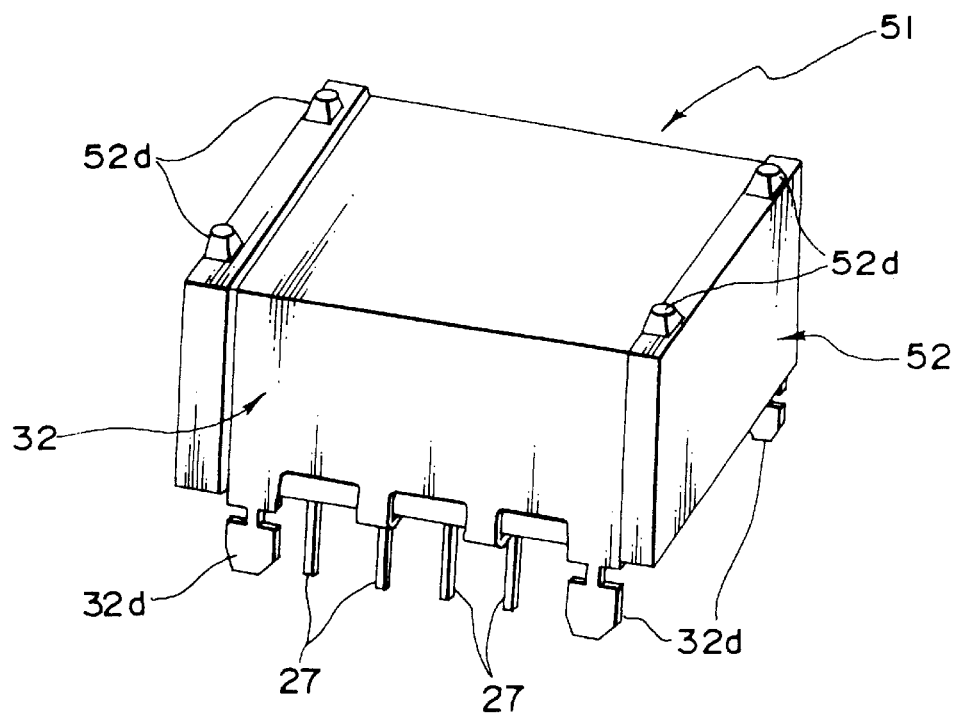
FIG. 9 is a perspective view of an acceleration sensor device according to a modification example of the second embodiment.

FIG. 9 shows an acceleration sensor device 51 according to a modification example of the second embodiment. The acceleration sensor device 51 is the horizontal type and has the same construction as that of the sensor device 21 of the modification example of the first embodiment shown in FIGS. 5 through 7 except for a resin package 52. Therefore, in regard to the components other than the package 52, the same components as those of the sensor device 21 will be denoted by the same reference numerals, and no further description is provided therefor.

In the case of the present modification example, the surface that is other than the bottom surface of the package 52 and is parallel to the principal plane of the sensor element 22 is only the upper surface of the package 52, and a plurality of (e.g., four) protrusions 52d are formed on the upper surface.

In the present case, by merely providing the protrusions 52d on the one surface of the package 52, an effect similar to that of the second embodiment can be produced.

Third embodiment

Figure 10:
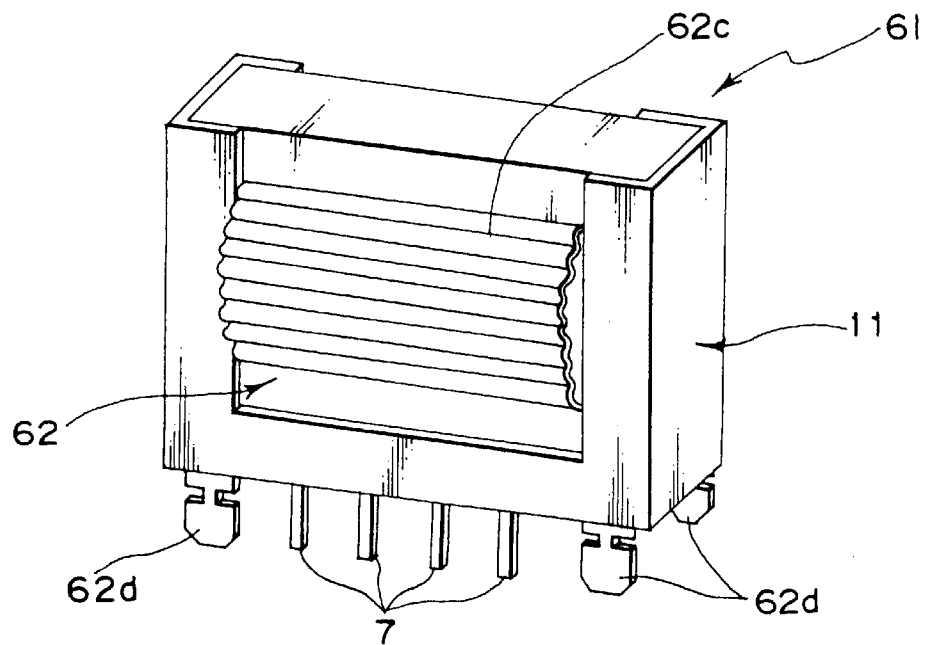
FIG. 10 is a perspective view of an acceleration sensor device according to a third embodiment of the present invention.

An acceleration sensor device 61 according to a third embodiment of the present invention as shown in FIG. 10 will be described next. It is to be noted that the present sensor device 61 is the upright type and has the same construction as that of the sensor device 1 of the first embodiment shown in FIGS. 1 through 4 except for a metal frame 62. Therefore, in regard to the components other than the metal frame 62, the same components as those of the aforementioned sensor device 1 are denoted by the same reference numerals, and no further description is provided therefor.

According to the present embodiment, the metal frame 62 is set so that its section including a portion corresponding to the place where the sensor element 2 is arranged is made to bulge outwardly of the package 11 in a plane parallel to the principal plane of the sensor element 2. Further, the bulged section 62c is more preferably formed in a wave-like form.

Thus by providing the metal frame 62 with the bulged section 62c, when an impact load is effected in a direction perpendicular to the principal plane in which the sensor element 2 has the lowest impact resistance, the impact load can be absorbed by the bulged section 62c. Furthermore, a plurality of leg sections 62d of the frame 62 are protruding from the bottom plane of the package 11 at the bottom surface side of the sensor element 2, and therefore, the impact load from the bottom surface side is absorbed by the leg sections 62d. Therefore, even though the impact load is effected as a consequence of drop or the like when the sensor device 61 is individually handled, the internally provided sensor element 2 can be effectively protected.

Furthermore, the bulged section 62c can be formed easily integrally in a molding stage of the frame 62. With the simple construction of providing the frame 62 with the bulged section 62c, the impact resistance in singly handling the sensor 61 can be improved.

In particular, the bulged section 62c of the frame 62 is formed in a wave-like form, and therefore, the impact load effected in the direction perpendicular to the principal plane of the sensor element 2 can be more effectively absorbed.

As a material of the frame 62, generally a copper-based (e.g., Be-Cu based or Cu-Ni-P based) alloy having a high resilience is preferable.

Modification example of Third embodiment

Figure 11:
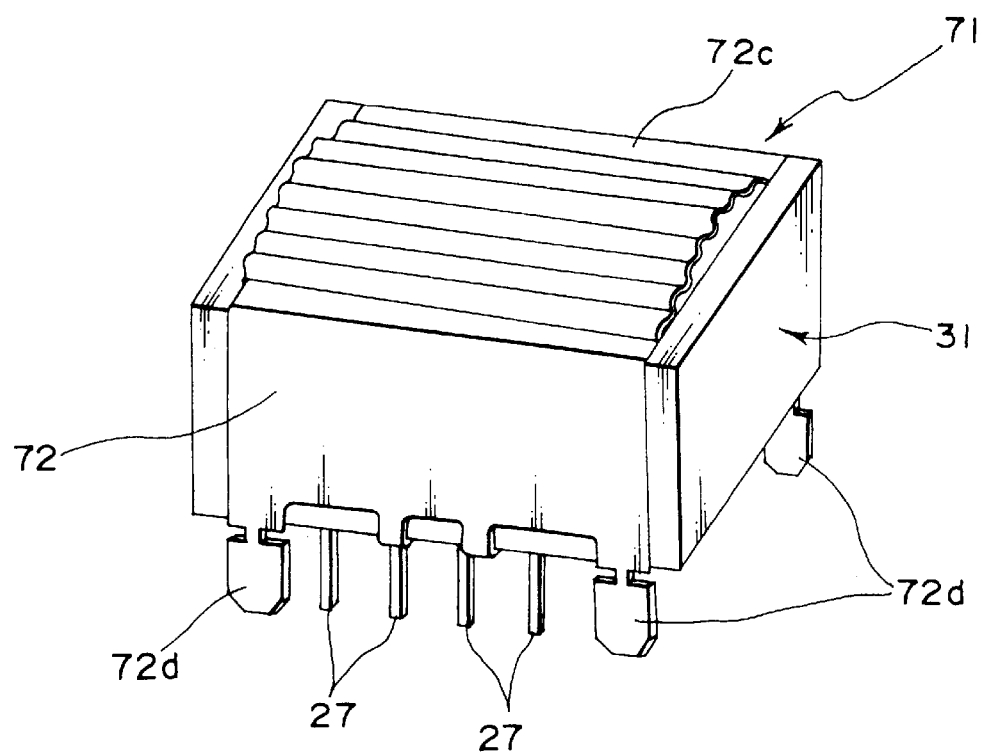
FIG. 11 is a perspective view of an acceleration sensor device according to a modification example of the third embodiment.

FIG. 11 shows an acceleration sensor device 71 according to a modification example of the third embodiment. This acceleration sensor device 71 is the horizontal type and has the same construction as that of the sensor device 21 of the modification example of the first embodiment shown in FIGS. 5 through 7 except for a metal frame 72. Therefore, in regard to the components other than the metal frame 72, the same components as those of the aforementioned sensor device 21 are denoted by the same reference numerals, and no further description is provided therefor.

In the case of the present modification example, the surface that is other than the bottom surface of the metal frame 72 and is parallel to the principal plane of the semiconductor sensor element 22 is only the upper surface. At the upper surface, a section including a portion corresponding to the place where the sensor element 2 is arranged is made to bulge outwardly of the package 11. Further, the bulged section 72c is more preferably formed in a wave-like form.

On the other hand, a plurality of leg sections 72d of the frame 72 are protruding from the bottom plane of the package 31 at the bottom surface side of the sensor element 2, and therefore, the impact load from the bottom surface side is absorbed by the leg sections 72d.

In the present case, by merely providing the bulged section 72d on one surface of the metal frame 72, an effect similar to that of the third embodiment can be produced.

It is to be noted that the present invention is not limited to any of the aforementioned embodiments, and the invention can be of course subject to a variety of improvements or modifications with regard to its design within the spirit and scope thereof.

According to the first embodiment of the present invention, the cap-shaped resin cover member has a roof section opposite to the upper surface of the package member or the frame member, and its side wall section extends at least to a position corresponding to the place where the semiconductor sensor element is arranged. Therefore, the upper portion and the side portion of the sensor element are covered with the resin cover member, and an impact load effected in any of these directions is effectively absorbed by the resin cover member. On the other hand, below the sensor element is protruding the plurality of leg sections of the frame member from the bottom plane of the package member, and therefore, the impact load from below is absorbed by the leg sections.

That is, even though an impact load is effected as a consequence of drop or the like when the acceleration sensor device is individually handled, the internally provided sensor element can be effectively protected. Furthermore, in this case, with the simple construction of putting the cap-shaped resin cover member on the sensor, the impact resistance in individually handling the acceleration sensor device can be improved.

In the present case, the resin cover member is more preferably fixed as removably engaged with the package member by a force within the elastic limit of its material. With this arrangement, for example, after completing individual handling of the acceleration sensor device or in a similar case, the cover member can be easily removed and is able to be easily reused for another acceleration sensor device.

Furthermore, according to the second embodiment of the present invention, the resin package member is provided with a plurality of protrusions which are formed integrally with the package member and protrude outwardly in the plane that is other than the bottom plane and is parallel to the principal plane of the semiconductor sensor element. With this arrangement, when an impact load greater than a certain intensity is effected in the direction perpendicular to the principal plane in which the sensor element has the lowest impact resistance, the protrusions will be deformed or broken to be able to absorb the impact load. On the other hand, the plurality of leg sections of the frame member are protruding from the bottom plane of the package member at the bottom surface side of the sensor element, and therefore, the impact load from the bottom surface side is absorbed by the leg sections.

That is, even though an impact load is effected as a consequence of dropping or the like when the acceleration sensor device is individually handled, the internally provided sensor element can be effectively protected. Furthermore, the protrusions can be formed easily integrally in the molding stage of the resin package member. With the simple construction of providing the package member with the plurality of protrusions, the impact resistance in individually handling the acceleration sensor device can be improved.

Furthermore, according to the third embodiment of the present invention, the metal frame member is set so that its section including a portion corresponding to the place where the semiconductor sensor element is arranged is made to bulge outwardly of the package member in the plane parallel to the principal plane of the semiconductor sensor element. Thus by providing the metal frame member with the bulged section, when an impact load is effected in the direction perpendicular to the principal plane in which the sensor element has the lowest impact resistance, the impact load can be absorbed by the bulged section. Furthermore, the plurality of leg sections of the frame member are protruding from the bottom plane of the package member at the bottom surface side of the sensor element, and therefore, the impact load from the bottom surface side is absorbed by the leg sections.

That is, even though an impact load is effected as a consequence of drop or the like when the acceleration sensor device is individually handled, the internally provided sensor element can be effectively protected. Furthermore, the bulged section can be formed easily integrally in the molding stage of the metal frame member. With the simple construction of providing the frame member with the bulged section, the impact resistance in individually handling the acceleration sensor device can be improved.

In the present case, the bulged section of the frame member is more preferably formed in a wave-like form. With this arrangement, the impact load effected in the direction perpendicular to the principal plane of the semiconductor sensor element can be more effectively absorbed.

What is claimed is:

1. An acceleration sensor device comprising:
    a semiconductor sensor element which can sense acceleration in a direction perpendicular to a specified plane;
    a base member which supports said sensor element;
    a package member which supports said base member and encloses said base member and said semiconductor sensor element;
    a frame member fixed on said package member, said frame member having a plurality of leg sections protruding from a bottom plane of said package member; and
    a cap-shaped resin cover member fixed to said package member, said cover member having a roof section opposite to an upper surface of said package member or said frame member and covering said package member from above, said cover member enclosing only part of said package member so that said plurality of leg sections protruding from a bottom plane of said package member are exposed, wherein
    a side wall section of said cover member extends at least to a position corresponding to a place where said sensor element is arranged.

2. An acceleration sensor device as claimed in claim 1, wherein said resin cover member is removable from said package member by a force within an elastic limit of its material.

3. An acceleration sensor device comprising:
    a semiconductor sensor element which can sense acceleration in a direction perpendicular to a specified plane;
    a base member which supports said sensor element;
    a resin package member which supports said base member and encloses said base member and said semiconductor sensor element; and
    a frame member fixed on said package member, said frame member having a plurality of leg sections protruding from a bottom plane of said package member, wherein
    said package member is provided with a plurality of protrusions which are formed integrally with said package member and each protrude outwardly from a plane that is parallel to said specified plane of said semiconductor sensor element.

4. An acceleration sensor device comprising:
    a semiconductor sensor element which can sense acceleration in a direction perpendicular to a specified plane;
    a base member which supports said sensor element;
    a package member which supports said base member and encloses said base member and said semiconductor sensor element;
    a metal frame member fixed on said package member and having a plurality of leg sections protruding from a bottom plane of said package member, wherein
    said frame member is set so that its section including a portion corresponding to a position where said sensor element is arranged bulges outwardly of said package from a plane that is parallel to said specified plane of said semiconductor sensor element.

5. An acceleration sensor device as claimed in claim 4, wherein said bulged section of said frame member has a wave-like surface.

* * * * *